United States Patent
Li et al.

(10) Patent No.: US 10,703,563 B2
(45) Date of Patent: Jul. 7, 2020

(54) STOCKER

(71) Applicant: Taiwan Semiconductor Manufacturing Co., Ltd., Hsinchu (TW)

(72) Inventors: Guan-Cyun Li, Miaoli County (TW); Chi-Feng Tung, Miaoli County (TW); Fu-Hsien Li, Taichung (TW); Hsiang-Yin Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/884,389

(22) Filed: Jan. 31, 2018

(65) Prior Publication Data

US 2019/0144205 A1    May 16, 2019

Related U.S. Application Data

(60) Provisional application No. 62/584,121, filed on Nov. 10, 2017.

(51) Int. Cl.
*B65G 1/04* (2006.01)
*H01L 21/677* (2006.01)

(52) U.S. Cl.
CPC ...... *B65G 1/0435* (2013.01); *H01L 21/67769* (2013.01)

(58) Field of Classification Search
CPC .................. B65G 1/0435; H01L 21/67769
See application file for complete search history.

(56) References Cited

U.S. PATENT DOCUMENTS

| | | | | |
|---|---|---|---|---|
| 3,455,469 A | * | 7/1969 | Evans ................. | B65G 1/0435 414/280 |
| 4,403,554 A | * | 9/1983 | Valentine ................. | A47F 5/10 108/180 |
| 5,211,296 A | * | 5/1993 | D'Heygere ............ | B65G 1/026 211/1.57 |
| 5,328,316 A | * | 7/1994 | Hoffmann ............ | B65G 1/0435 187/404 |
| 5,361,481 A | * | 11/1994 | Lloyd ................. | B65G 1/0407 29/407.01 |
| 5,487,636 A | * | 1/1996 | Mkrtchyan .......... | B65G 1/0435 414/245 |

(Continued)

FOREIGN PATENT DOCUMENTS

| | | | | |
|---|---|---|---|---|
| DE | 9218776 U1 | * | 6/1995 | ............. B65G 1/026 |
| EP | 2062836 A1 | * | 5/2009 | ........... B65G 1/0435 |

(Continued)

*Primary Examiner* — Stanton L Krycinski
(74) *Attorney, Agent, or Firm* — JCIPRNET

(57) ABSTRACT

A stocker for storing a plurality of wafer carriers is provided. The stocker includes a frame, a plurality of pod stoppers, a plurality of truss members and a plurality of partitions. The frame includes a plurality of stocking units. Each of the stocking units includes a carrying plate for carrying one of the plurality of wafer carriers. The pod stoppers stand on an edge of each of the carrying plates. The truss members are disposed diagonally across at least one side surface of at least one of the stocking units, wherein each of the truss members comprises a shock absorber. The partitions are disposed on side surfaces of the stocking units and fixed to the frame.

13 Claims, 5 Drawing Sheets

(56) References Cited

U.S. PATENT DOCUMENTS

| | | | |
|---|---|---|---|
| 6,024,425 A * | 2/2000 | Imai | A47F 1/00 312/35 |
| 6,558,101 B2 * | 5/2003 | Inui | B65G 1/0435 414/267 |
| 7,998,890 B2 * | 8/2011 | Flack | B32B 5/26 428/920 |
| 8,928,481 B2 * | 1/2015 | Abe | B65G 1/0435 235/383 |
| 9,187,300 B2 * | 11/2015 | Yoshioka | B66F 9/07 |
| 9,296,559 B2 * | 3/2016 | Nomura | B65G 1/02 |
| 9,365,347 B2 * | 6/2016 | Nakamura | B65G 1/0407 |
| 9,541,534 B2 * | 1/2017 | Otsuka | G01N 33/0009 |
| 9,595,461 B2 * | 3/2017 | Takahara | F17C 13/02 |
| 9,679,795 B2 * | 6/2017 | Otsuka | H01L 21/67769 |
| 9,682,821 B2 * | 6/2017 | Sakamoto | B65G 1/045 |
| 9,685,361 B2 * | 6/2017 | Yoshioka | H01L 21/67769 |
| 9,718,617 B2 * | 8/2017 | Koide | B65G 1/0492 |
| 9,818,634 B2 * | 11/2017 | Omori | H01L 21/67769 |
| 9,822,929 B2 * | 11/2017 | Shin | F17C 5/007 |
| 10,023,385 B2 * | 7/2018 | Shibata | H01L 21/67769 |
| 10,081,951 B2 * | 9/2018 | Omori | E04F 13/086 |
| 10,083,848 B2 * | 9/2018 | Tominaga | A47B 81/00 |
| 10,160,597 B2 * | 12/2018 | Ueda | B65G 1/137 |
| 10,274,214 B2 * | 4/2019 | Otsuka | F24F 3/161 |
| 10,287,096 B2 * | 5/2019 | Yoshimoto | H01L 21/67769 |
| 10,354,897 B2 * | 7/2019 | Abe | H01L 21/673 |
| 10,354,898 B2 * | 7/2019 | Abe | H01L 21/67393 |
| 10,361,109 B2 * | 7/2019 | Omori | H01L 21/67769 |
| 10,373,851 B2 * | 8/2019 | Abe | H01L 21/67389 |
| 2003/0102277 A1 * | 6/2003 | Tai | B65G 1/02 211/187 |
| 2004/0074808 A1 * | 4/2004 | Bhatt | H01L 21/67366 206/711 |
| 2004/0228709 A1 * | 11/2004 | Ueda | B65G 1/0421 414/279 |
| 2004/0228710 A1 * | 11/2004 | Ueda | B65G 1/0421 414/279 |
| 2008/0044262 A1 * | 2/2008 | Kim | B65G 1/0421 414/273 |
| 2011/0108218 A1 * | 5/2011 | Flack | B32B 5/26 160/371 |
| 2011/0156332 A1 * | 6/2011 | Kishimoto | B65G 1/0407 269/56 |
| 2015/0203295 A1 * | 7/2015 | Nakamura | B66F 9/07 414/274 |
| 2016/0293468 A1 * | 10/2016 | Morikawa | H01L 21/67769 |
| 2016/0347543 A1 * | 12/2016 | Heide | B65G 1/0435 |
| 2018/0076059 A1 * | 3/2018 | Abe | H01L 21/6773 |

FOREIGN PATENT DOCUMENTS

| | | | | |
|---|---|---|---|---|
| WO | WO-8603246 A1 * | 6/1986 | | B65G 1/0435 |
| WO | WO-03018443 A1 * | 3/2003 | | B65G 1/0435 |
| WO | WO-2011006601 A1 * | 1/2011 | | B65G 1/0407 |

* cited by examiner

STOCKER

CROSS-REFERENCE TO RELATED APPLICATION

This application claims the priority benefit of U.S. provisional application Ser. No. 62/584,121, filed on Nov. 10, 2017. The entirety of the above-mentioned patent application is hereby incorporated by reference herein and made a part of this specification.

BACKGROUND

Semiconductor integrated circuit fabrication facilities ("fabs") are highly automated. Movement of semiconductor wafers between various process tools is accomplished by an automated material handling system (AMHS). The wafers are typically transported through the fab in Front Opening Unified Pods (FOUPs), wafer holding devices capable of holding up to 25 wafers of 300 mm diameter.

A FOUP is a specialized enclosure designed to hold semiconductor wafers securely and safely in a controlled environment, and to allow the wafers to be removed for processing or measurement by tools equipped with appropriate load ports and robotic handling systems. Slots in the FOUP hold the wafers in place, and a front opening door allows robot handling mechanisms to access the wafers directly from the FOUP. A FOUP can be located on a load port, and can be manipulated by the AMHS.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
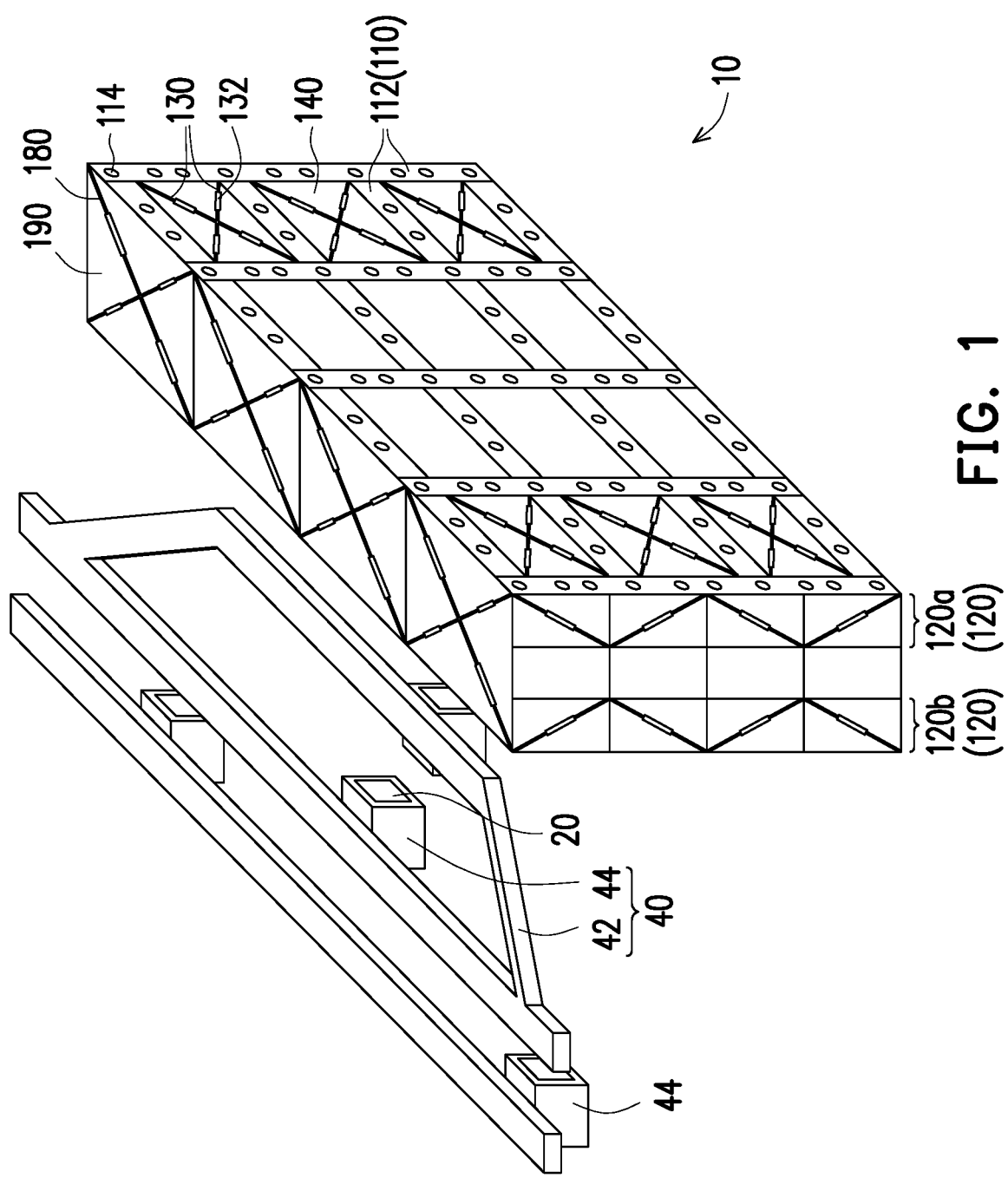
FIG. 1 illustrates a schematic view of a stocker according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
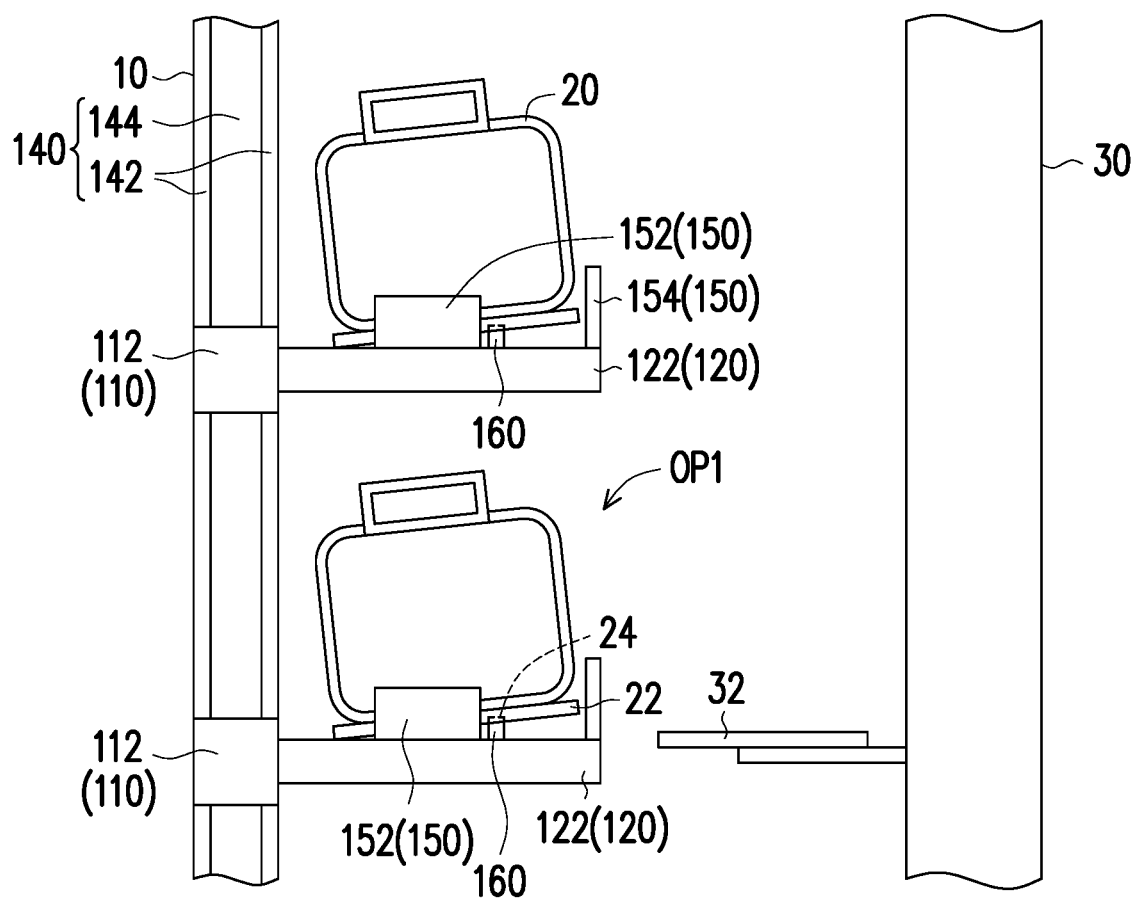
FIG. 2 illustrates a side view of an operation scenario accessing a wafer carrier from a stocker according to some exemplary embodiments of the present disclosure.

FIG. 1 illustrates a schematic view of a stocker according to some exemplary embodiments of the present disclosure. FIG. 2 illustrates a side view of an operation scenario accessing a wafer carrier from a stocker according to some exemplary embodiments of the present disclosure. Referring to FIG. 1 and FIG. 2, in some embodiments, a stocker 10 may be employed within a complex non-linear multi-step manufacturing process, wherein the stocker may be operated with enhanced mechanical strength. In some embodiments, the complex non-linear multi-step manufacturing processes may include but not limited to mechanical manufacturing processes, electrical manufacturing processes, electro-mechanical manufacturing processes and electronic manufacturing processes, etc. In general, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc.

A partially processed semiconductor wafer may be conveyed between various work stations many times before the fabrication process is completed. The partially processed semiconductor wafers or work-in-process (WIP) parts are conveyed via a transport device 40. In some embodiments, the transport device 40 may include a track 42 arranged along predetermined routes and a plurality of vehicles 44 configured to travel on the track 42. In some embodiments, the transport device 40 may be, but not limited to, an automatic guided vehicles (AGV), an overhead hoist transport (OHT), etc. The semiconductor wafers are normally loaded into a plurality of wafer carriers 20, such as but not limited to SMIF (standard machine interface) or FOUP (front opening unified pod), etc., for the conveying of semiconductor wafers, and then picked up and placed in the automatic conveying vehicles. In some embodiments, the stocker 10 is configured for storing a plurality of wafer carrier 20. The stocker 10 may be in conjunction with the transport device 40 for the storing and transporting of semiconductor wafers in the wafer carriers 20. In some embodiments, the vehicles 44 may include a plurality of grippers, which may be raised and lowered by a plurality of guiding rods respectively. As such, the vehicles 44 can grip a top flange of the wafer carrier 20 by the gripper to transport, pick up and place the wafer carriers 20 to certain locations.

In some embodiments, the transport device 40 such as but not limited to AGV and OHT are extensively used to automate the wafer transport process as much as possible. The AGE and OHT utilize input/output ports of the stocker 10 to load or unload the wafer carriers 20. FIG. 1 illustrates the transport device 40 consisting of the vehicles 44 carrying wafer carriers and traveling on the track 42. The vehicles 44 of the transport device 40 may stop at a certain position for unloading the wafer carriers 20 into the stocker 10 or loading the wafer carriers 20 from the stocker 10.

In some embodiments, referring to FIG. 1 and FIG. 2, the stocker 10 includes a frame 110, a plurality of truss members 130 and a plurality of partitions 140 as shown in FIG. 1. The frame 110 includes a plurality of stocking units 120 for storing the wafer carriers 20. In some embodiments, the material of the frame 110 may include aluminum for providing favorable mechanical strength while being lightweight, but the disclosure is not limited thereto. The truss members 130 are disposed diagonally across at least one side surface of at least one of the stocking units 120 to reinforce the mechanical strength of the stocking units 120. In some embodiments, each of the truss members 130 is diagonally disposed from a top corner to a bottom corner of the stocking unit 120 at about a 45-degree angle. Two of the truss members 130 may be crossed with each other on a side surface of one of the stocking units 120 as shown in FIG. 1. In some embodiments, the truss members 130 are disposed diagonally across the back surfaces of the stocking units 120, which are located on a peripheral region of the frame 110. For example, the truss members 130 may be disposed on the stocking units 120 located on the right side and the left side of the frame 110, but the disclosure is not limited thereto.

Accordingly, with the arrangement of the truss members 130, the mechanical strength of the stocker 100 is improved. In addition, the stocker 10 has a natural frequency, which is the frequency at which the stocker 10 tends to oscillate in the absence of any driving or damping force. If the frequency the stocker 10 matches the oscillation frequency of the building where the stocker 10 is located, resonance between the stocker 10 and the building is occurred, and the stocker 10 may undergo the largest oscillations possible and suffer the greatest damage. Therefore, the number and the arrangement of the truss members 130 can be adjusted to avoid the significant oscillations of the stocker 10 due to resonance between the stocker 10 and the building during earthquake.

In some embodiments, each of the truss members 130 may include a shock absorber 132. The shock absorber 132 (also known as a shock damper) may be a mechanical or hydraulic device designed to absorb resonant frequencies and damp shock impulses. For example, the shock absorber 132 is configured to absorb resonant frequencies by converting the kinetic energy of the shock into another form of energy (e.g. thermal energy) which is then dissipated. Accordingly, the impact on the oscillations of the stocker 10 during earthquake can be further reduced. The materials of the truss members 130 and the shock absorber 132 may include stainless steel or any other suitable material.

In some embodiments, the partitions 140 may be disposed on side surfaces of the stocking units 120 and fixed to the frame 110. In one of the implementations, the partitions 140 may be disposed on exterior walls of the stocker 10. In other words, the partitions 140 may be disposed on the exterior side surfaces of each of the stocking units 120. In some embodiments, each of the stocking units 120 may have a front open end OP1 for the robotic device 30 to be able to access the wafer carrier 20 stored therein as shown in FIG. 2. Accordingly, the partitions 140 may be disposed on the side surfaces of each stocking unit 120 except for the front side surface of each stocking unit 120.

In addition, the frame 110 may further include a plurality of bracing members 112 to form the stocking units 120. The truss members 130 are fixed to the bracing members 112 to provide diagonally support to the bracing members 112. The partitions 140 cover the truss members 130 and are fixed to the bracing members 112 by a plurality of fasten components 114 such as but not limited to screws, hinges, etc. It is noted that the partitions 140 in FIG. 1 are illustrated in perspective manner so as to show the configuration of the truss members 130 underneath. Accordingly, the partitions 140, the truss members 130 and the shock absorbers 132 are arranged to modify the natural frequency of the stocker 10, such that the resonance between the stocker 10 and the building where the stocker 10 is installed during earthquake can be avoided. In some embodiments, the stocker 10 is designed to take into account the oscillating frequencies of expected ground motion and to resonate at a frequency that does not typically occur.

In some embodiments, each of the partitions 140 may include a plurality of fire resistant layers 142 and a metal layer 144 sandwiched in between the fire resistant layers 142. For example, the material of the fire resistant layer 142 may include Polyethylene (PE) or any other suitable fire resistant material. The material of the metal layer may include aluminum or any other suitable metal material. Thereby, the partitions 140 are capable of providing structural support and fire resistant characteristics to the stocking units 120.

Figure 3:
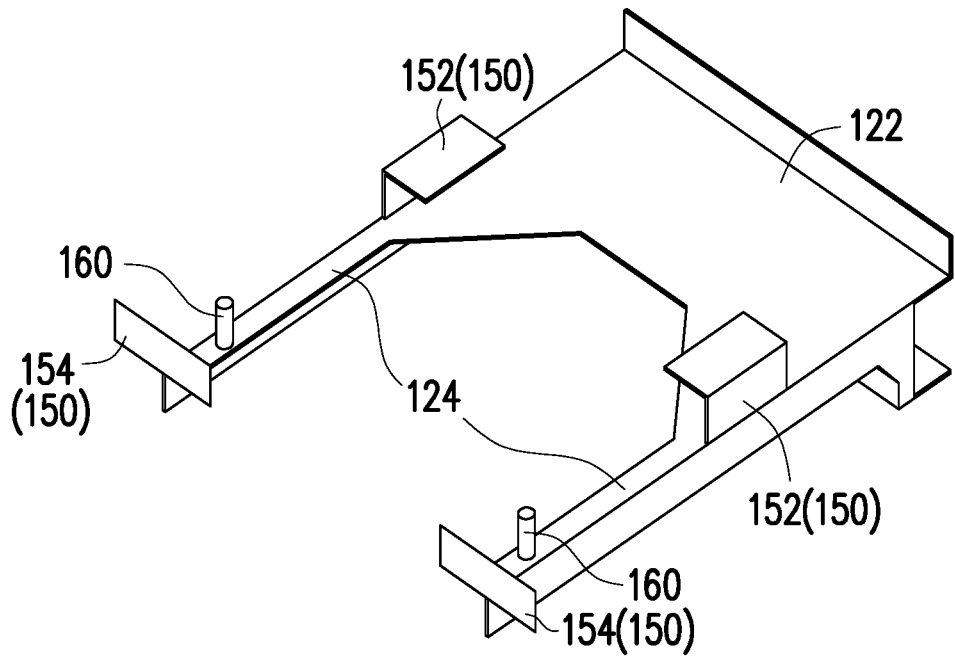
FIG. 3 illustrates a schematic view of a carrying plate of a stocking unit according to some exemplary embodiments of the present disclosure.
Figure 4:
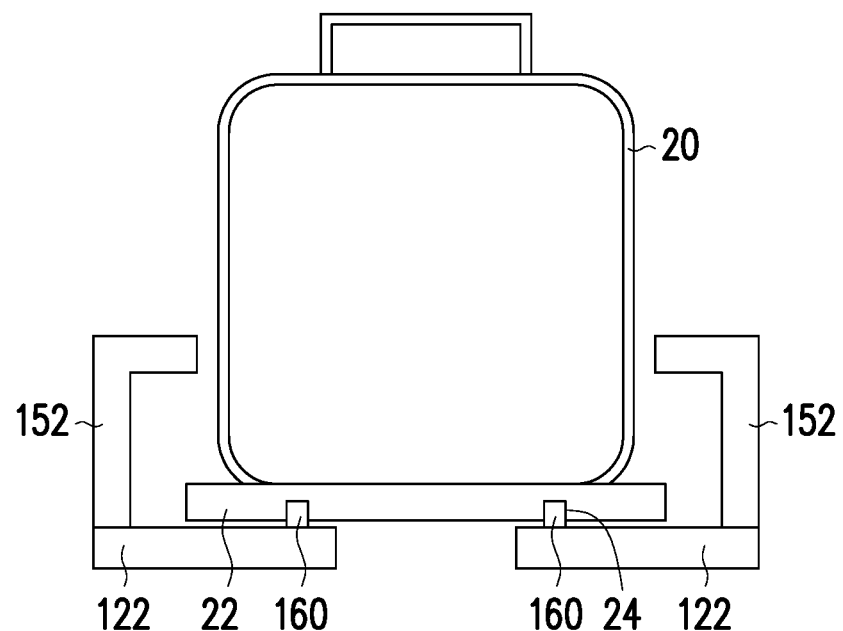
FIG. 4 illustrates a cross sectional view of a wafer carrier in a stocking unit according to some exemplary embodiments of the present disclosure.

FIG. 3 illustrates a schematic view of a carrying plate of a stocking unit according to some exemplary embodiments of the present disclosure. FIG. 4 illustrates a cross sectional view of a wafer carrier in a stocking unit according to some exemplary embodiments of the present disclosure. Referring to FIG. 2 to FIG. 4, in some embodiments, each of the stocking units 120 includes a carrying plate 122 for carrying one of the wafer carriers 20. Each of the stocking units 120 may further include a plurality of pod stoppers 150 and at least one positioning pin 160 (two positioning pins 160 are illustrated but not limited thereto). In some embodiments, the pod stoppers 150 stands on an edge of the carrying plate 122 as shown in FIG. 3. In some embodiments, the height of each of the pod stoppers 150 may be, for example, greater than 3% of the height of the wafer carrier 20 to restrain the movement of the wafer carriers 20 during earthquake or any oscillation. In one of the implementations, the height of each of the pod stoppers 150 may range from 1.5 cm to 4.5 cm, but the disclosure is not limited thereto. The positioning pins 160 may be disposed on a front portion of the carrying plate 122, such that the wafer carrier 20 leans against the positioning pins 160 and is tilted toward a back portion of the carrying plate 122 as shown in FIG. 2. With such arrangement, the pod stoppers 150 can hold the wafer carriers 20 in place, so as to keep the wafer carriers 20 from falling when earthquake or any oscillation occurs. In addition, with the configuration of the wafer carrier 20 tilted backward due to the positioning pins 16, the risk of the wafer carriers 20 falling from the front open end OP1 of the stocking units 120 during earthquake can be further reduced.

In some embodiments, a bottom portion 22 of the wafer carrier 20 may include at least one positioning hole 24 configured to be engaged with the at least one positioning pin 160. The number of the positioning hole 24 may match the number of the positioning pin 160, and a height of the positioning pin 160 is higher than a depth of the positioning hole 24. In one of the implementations, the depth of the positioning hole 24 may substantially be 0.5 cm, but the disclosure is not limited thereto. Thereby, the wafer carriers 20 not only are positioned by the positioning pin 160 but also are tilted toward the back portion of the carrying plate 122 to further reduce the risk of the wafer carriers 20 falling from the front open end OP1 of the stocking units 120 during earthquakes or any oscillations.

In some embodiments, the front portion of the carrying plate 122 is in an arched shape and includes two extended sides 124 as shown in FIG. 3. Accordingly, when the wafer carrier 20 is disposed on the carrying plate 122, the bottom portion 22 of the wafer carrier 20 is partially exposed by the arch of the carrying plate 122. As such, the robotic arm 32 of the robotic device 30 as shown in FIG. 2 may be extended into the arch of the carrying plate 122 to pick up the wafer carrier 20. With such configuration, two positioning pins 160 may be disposed on the two extended sides 124 respectively as shown in FIG. 3.

In addition, the pod stoppers 150 may include a plurality of side stoppers 152 and a plurality of front stoppers 154. The side stoppers 152 are disposed on side surfaces of the two extended sides 124 to restrain the horizontal displacement of the wafer carrier 20 within the two side surfaces of the two extended sides 124. In some embodiments, the size of the bottom portion 22 may be slightly larger than the size of the main body of the wafer carrier 20 as shown in FIG. 4. Accordingly, each side stopper 152 may be in a reversed L shape, so as to restrain the vertical displacement of the bottom portion 22 of the wafer carrier 20 within the height of the side stoppers 152. The front stoppers 154 are disposed on front surfaces of the two extended sides 124 to prevent the wafer carriers 20 from falling off via the front opening end OP1 due to earthquakes or any oscillations.

Figure 5:
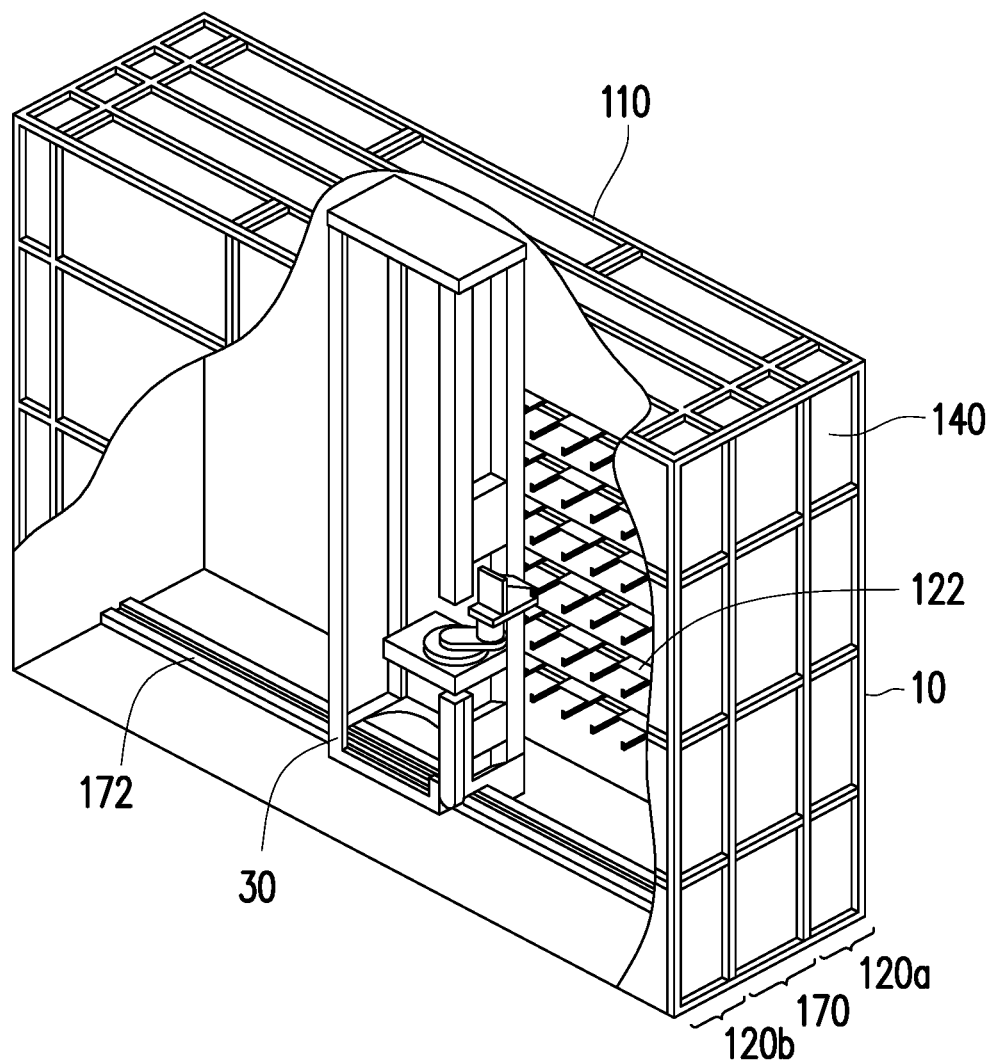
FIG. 5 illustrates a perspective view of a stocker according to some exemplary embodiments of the present disclosure.
Figure 6:
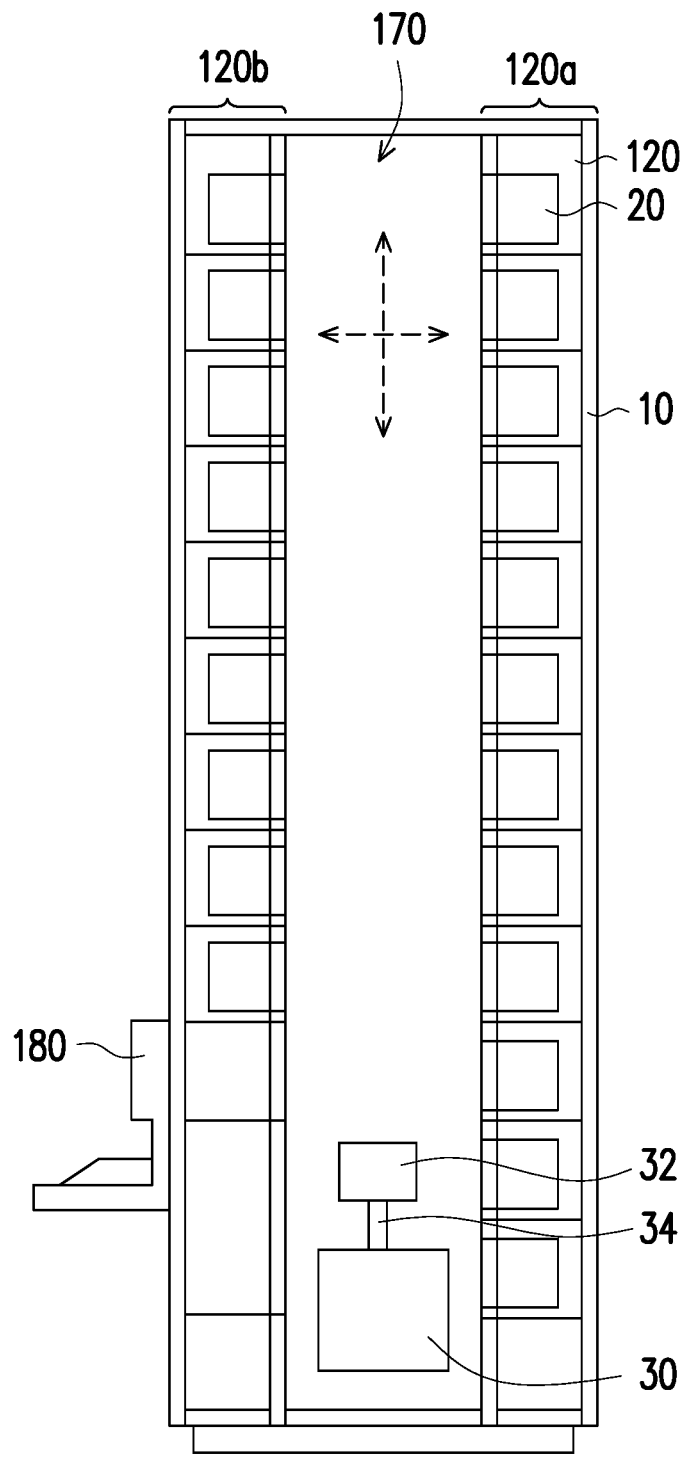
FIG. 6 illustrates a cross sectional view of a stocker according to some exemplary embodiments of the present disclosure.

FIG. 5 illustrates a perspective view of a stocker according to some exemplary embodiments of the present disclosure. FIG. 6 illustrates a cross sectional view of a stocker according to some exemplary embodiments of the present disclosure. Referring to FIG. 1, FIG. 5 and FIG. 6, in some embodiments, the stocking units 120 may include a first stocking unit set 120a and a second stocking unit set 120b facing each other. In other words, the stocking units 120 may include a plurality of first stocking units, which constitute the first stocking unit set 120a, and a plurality of second stocking units, which constitute the second stocking unit set 120b. In some embodiments, the first stocking unit set 120a may be mirrored to the second stocking unit set 120b. The stocker 10 may further include a core passage 170, which is disposed between the first stocking unit set 120a and the second stocking unit set 120b. In other words, the first stocking unit set 120a and the second stocking unit set 120b are separated from each other by the core passage 170. The robotic device 30 is mobile along the core passage 170 to access or store the wafer carriers 20 within either the first stocking unit set 120a or the second stocking unit 120b.

In some embodiments, the core passage 170 may include a guiding rail 172, and the robotic device 30 is configured to move along the guiding rail 172. In addition, the robotic arm 32 of the robotic device 30 may be elevated and lowered by, for example, a guiding rod 34 respectively. Moreover, the robotic arm 32 may be extended to reach either the first stocking unit set 120a or the second stocking unit set 120b. With such configurations, the robotic device 30 is capable of accessing every wafer carrier 20 in the first stocking unit set 120a and the second stocking unit set 120b.

In addition, referring back to FIG. 1, the stocker 10 may further include a plurality of top truss members 180 and a plurality of top partitions 190. Each of the top partitions 190 covers a top unit the first stocking unit set 120a, a top unit of the second stocking unit 120b and the core passage 170. In some embodiments, each of the top partitions 190 covers one of the topmost stocking units of the first stocking unit set 120a, one of the topmost stocking units of the second stocking unit set 120b and the corresponding part of the core passage 170 as shown in FIG. 1. The top truss members 180 are covered by the top partitions 190 and one of the top truss members 180 is disposed diagonally across one of the top partitions 190. In other words, one of the topmost stocking units of the first stocking unit set 120a, one of the topmost stocking units of the second stocking unit set 120b and the corresponding part of the core passage 170 may constitute a unit. Accordingly, each of the top truss members 180 is disposed diagonally across a top surface of such unit, and the top partitions 190 cover the top truss members 180. In some embodiments, two of the top truss members 180 may be crossed with each other on the top surface of one of the units, and one of the top partitions 190 covers the two of the top truss members 180. It is noted that the top partitions 190 in FIG. 1 are illustrated in perspective manner so as to show the configuration of the top truss members 180 underneath. In some embodiments, one of the truss members 130 may be diagonally disposed across a side surface of one of the stocking units of the stocking unit sets 120a, 120b and is covered by one of the partitions 140.

In some embodiments, apart from the differences in sizes, the structures of the top truss members 180 may be substantially the same as the structures of the truss members 130. In other words, each of the top truss members 180 may also include a shock absorber configured to absorb resonant frequencies and damp shock impulses. Similarly, apart from the differences in sizes, the structures of the top partitions 190 may be substantially the same as the structures of the partitions 140. In other words, each of the partitions 140 may also include a plurality of fire resistant layers and a metal layer sandwiched in between the fire resistant layers to provide structural support and fire resistant characteristics to the stocker 10. The arrangement of the top partitions 190 and the top truss members 180 further enhances the mechanical strength of the stocker 10 and locks the first stocking unit set 120a, the core passage 170, and the second stocking unit set 120b in place. In addition, the top partitions 190 and the top truss members 180 are arranged to avoid resonance between the stocker 10 and the building where the stocker 10 is installed during earthquake or any oscillations.

Although the present embodiment of the disclosure illustrates that the stocker 10 is formed in a generally rectangular geometric configuration, the disclosure may also be employed in general with respect to a stocker of alternative geometric shapes. Such alternative geometric configurations may include, but are not limited to, circular configurations and regular polygonal configurations. In addition, the present embodiment of the disclosure illustrates that the stocker 10 includes the core passage 170 having positioned therein the robotic device 30, which is mobile within the core passage 170. However, in other embodiments, the robotic device 30, such as but not limited to a random access robot or other non-robotic random access transportation device, need not necessarily be fully mobile within the stocker 10.

In some embodiments, an operator interface 180, which includes a controller, configured to control the robotic device 30.

As is similarly understood by a person skilled in the art, and from a practical perspective, in order for the stocker 10 to be more efficiently operative, the robotic device 30 employed within the stocker 10 will generally, but not necessarily exclusively, be positioned on the same side of stocking units 120.

In accordance with some embodiments of the disclosure, a stocker for storing a wafer carrier comprises a stocking unit, a plurality of pod stoppers and at least one positioning pin. The stocking unit comprises a carrying plate for carrying the wafer carrier. The pod stoppers stand on an edge of the carrying plate. The at least one positioning pin is disposed on a front portion of the carrying plate, such that the wafer carrier leans against the at least one positioning pin and is tilted toward a back portion of the carrying plate.

In accordance with some embodiments of the disclosure, a stocker for storing a plurality of wafer carriers comprises a frame, a plurality of truss members and a plurality of partitions. The frame comprises a plurality of stocking units for storing the plurality of wafer carriers. The truss members are disposed diagonally across at least one side surface of at least one of the stocking units. The partitions are disposed on side surfaces of the stocking units and fixed to the frame.

In accordance with some embodiments of the disclosure, a stocker for storing a plurality of wafer carriers comprises a frame, a plurality of pod stoppers, a plurality of truss members and a plurality of partitions. The frame comprises a plurality of stocking units, wherein each of the stocking units comprises a carrying plate for carrying one of the plurality of wafer carriers. The pod stoppers stand on an edge of each of the carrying plates. The truss members are disposed diagonally across at least one side surface of at least one of the stocking units, wherein each of the truss members comprises a shock absorber. The partitions are disposed on side surfaces of the stocking units and fixed to the frame.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stocking system, comprising:
    a plurality of wafer carriers;
    a frame comprising a plurality of stocking units for storing the plurality of wafer carriers;
    a plurality of truss members disposed diagonally across at least one side surface of at least one of the stocking units; and
    a plurality of partitions disposed on side surfaces of the stocking units and fixed to the frame,
    wherein the plurality of stocking units respectively comprise a carrying plate and a positioning pin disposed on a front portion of the carrying plate, such that each wafer carrier leans against the corresponding positioning pin and is tilted toward a back portion of the corresponding carrying plate.

2. The stocking system as claimed in claim 1, wherein each of the truss members comprises a shock absorber.

3. The stocking system as claimed in claim 1, wherein each of the partitions comprises a plurality of fire resistant layers and a metal layer sandwiched in between the fire resistant layers.

4. The stocking system as claimed in claim 1, wherein the frame further comprises a plurality of bracing members to form the stocking units, and the partitions cover the truss members and are fixed to the bracing members.

5. The stocking system as claimed in claim 1, wherein the truss members are disposed on the at least one of the stocking units located on a peripheral region of the frame.

6. The stocking system as claimed in claim 1, wherein the stocking units further comprises a first stocking unit set and a second stocking unit set facing each other, the stocker further comprises a core passage disposed between the first stocking unit set and the second stocking unit set for a robotic device to be mobile along core passage.

7. The stocking system as claimed in claim 6, further comprising:
    a plurality of top partitions, wherein each of the top partitions covers a top unit the first stocking unit set, a top unit of the second stocking unit set and the core passage; and
    a plurality of top truss members covered by the top partitions, wherein one of the top truss members disposed diagonally across one of the top partitions.

8. A stocker for storing a plurality of wafer carriers, comprising:
    a frame comprising a plurality of stocking units, wherein each of the stocking units comprises a carrying plate for carrying one of the plurality of wafer carriers;
    a plurality of pod stoppers standing on an edge of each of the carrying plates;
    a plurality of truss members disposed diagonally across at least one side surface of at least one of the stocking units, wherein each of the truss members comprises a shock absorber; and
    a plurality of partitions disposed on side surfaces of the stocking units and fixed to the frame,
    wherein the carrying plates are configured to support the plurality of wafer carriers from below the plurality of wafer carriers, the pod stoppers extend from a top surface of the corresponding carrying plate on which the corresponding wafer carrier is placed, and configured to restrain movement of the corresponding wafer carrier.

9. The stocker as claimed in 8, further comprising:
    two positioning pins disposed on a front portion of each of the carrying plates, such that each of the wafer carriers leans against the positioning pins and is tilted toward a back portion of each of the carrying plates.

10. The stocker as claimed in claim 9, wherein the front portion of each of the carrying plates is in an arched shape and comprises two extended sides, and the two positioning pins are disposed on the two extended sides respectively.

11. The stocker as claimed in claim 8, wherein the pod stoppers comprises:
    a plurality of side stoppers disposed on side surfaces of the carrying plates; and
    a plurality of front stoppers disposed on front surfaces of the carrying plates.

12. The stocker as claimed in claim 8, wherein the stocking units further comprises a first stocking unit set and a second stocking unit set facing each other, the stocker further comprises a core passage disposed between the first stocking unit set and the second stocking unit set for a robotic device to be mobile along core passage.

13. The stocker as claimed in claim 12, further comprising:
   a plurality of top partitions, wherein each of the top partitions covers a top unit the first stocking unit set, a top unit of the second stocking unit set and the core passage; and
   a plurality of top truss members covered by the top partitions, wherein one of the top truss members disposed diagonally across one of the top partitions.

* * * * *